United States Patent
Ostermaier et al.

(10) Patent No.: US 9,647,104 B2
(45) Date of Patent: May 9, 2017

(54) GROUP III-NITRIDE-BASED ENHANCEMENT MODE TRANSISTOR HAVING A HETEROJUNCTION FIN STRUCTURE

(71) Applicant: Infineon Technologies Austria AG, Villach (AT)

(72) Inventors: Clemens Ostermaier, Villach (AT); Gerhard Prechtl, St. Jakob i. Rosental (AT); Oliver Haeberlen, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 14/699,785

(22) Filed: Apr. 29, 2015

(65) Prior Publication Data

US 2015/0255590 A1 Sep. 10, 2015

Related U.S. Application Data

(63) Continuation of application No. 14/168,694, filed on Jan. 30, 2014, now Pat. No. 9,048,303.

(51) Int. Cl.
| | | |
|---|---|---|
| *H01L 29/778* | (2006.01) | |
| *H01L 29/06* | (2006.01) | |
| *H01L 29/423* | (2006.01) | |
| *H01L 29/205* | (2006.01) | |
| *H01L 29/10* | (2006.01) | |
| *H01L 29/20* | (2006.01) | |

(52) U.S. Cl.
CPC ...... *H01L 29/7786* (2013.01); *H01L 29/0646* (2013.01); *H01L 29/0657* (2013.01); *H01L 29/0688* (2013.01); *H01L 29/1066* (2013.01); *H01L 29/205* (2013.01); *H01L 29/4236* (2013.01); *H01L 29/42356* (2013.01); *H01L 29/7783* (2013.01); *H01L 29/7787* (2013.01); *H01L 29/2003* (2013.01); *H01L 29/42316* (2013.01)

(58) Field of Classification Search
CPC ..................................................... H01L 29/785
See application file for complete search history.

(56) References Cited

U.S. PATENT DOCUMENTS

| | | | |
|---|---|---|---|
| 7,271,429 B2 | 9/2007 | Saito et al. | |
| 7,728,356 B2 | 6/2010 | Suh et al. | |
| 7,732,837 B2 | 6/2010 | Saito et al. | |
| 7,750,369 B2 * | 7/2010 | Ohta | B82Y 10/00 257/192 |
| 8,264,032 B2 | 9/2012 | Yeh et al. | |
| 8,338,860 B2 * | 12/2012 | Bhalla | H01L 29/1029 257/192 |

(Continued)

OTHER PUBLICATIONS

Liu, S. "Enhancement-Mode Operation of Nanochannel Array (NCA) AlGaN/GaN HEMTs" IEEE Elec. Dev. Lett. vol. 33, No. 3 Mar. 2012 pp. 354-356.*

(Continued)

*Primary Examiner* — Asok K Sarkar
*Assistant Examiner* — Grant Withers
(74) *Attorney, Agent, or Firm* — Murphy, Bilak & Homiller, PLLC

(57) ABSTRACT

A Group III-nitride-based enhancement mode transistor having a heterojunction fin structure and a corresponding semiconductor device are described.

9 Claims, 5 Drawing Sheets

(56) References Cited

U.S. PATENT DOCUMENTS

| | | | |
|---|---|---|---|
| 8,420,459 | B1 | 4/2013 | Cheng et al. |
| 8,748,940 | B1 | 6/2014 | Rachmady et al. |
| 8,815,668 | B2 | 8/2014 | Basker et al. |
| 8,895,395 | B1 | 11/2014 | Kerber et al. |
| 8,927,371 | B2 | 1/2015 | Ko et al. |
| 8,927,966 | B2 | 1/2015 | Liu et al. |
| 8,994,035 | B2* | 3/2015 | Simin et al. .............. 257/77 |
| 9,214,538 | B2* | 12/2015 | Marino ............. H01L 29/7787 |
| 2004/0041169 | A1* | 3/2004 | Ren ................. H01L 29/78 257/192 |
| 2004/0157353 | A1 | 8/2004 | Ouyang et al. |
| 2006/0022262 | A1 | 2/2006 | Yoon et al. |
| 2006/0197129 | A1* | 9/2006 | Wohlmuth ........ H01L 29/42384 257/296 |
| 2007/0117355 | A1* | 5/2007 | Ueda ................ H01L 29/045 438/478 |
| 2008/0135886 | A1 | 6/2008 | Irisawa et al. |
| 2008/0237639 | A1* | 10/2008 | Nanjo et al. .............. 257/194 |
| 2009/0072272 | A1* | 3/2009 | Suh ................ H01L 29/1066 257/194 |
| 2009/0251946 | A1 | 10/2009 | Juengling |
| 2010/0207166 | A1* | 8/2010 | Zhu ..................... 257/201 |
| 2010/0258848 | A1* | 10/2010 | Lidow et al. ............ 257/288 |
| 2010/0320443 | A1 | 12/2010 | Jiang et al. |
| 2011/0049568 | A1 | 3/2011 | Lochtefeld et al. |
| 2011/0210377 | A1* | 9/2011 | Haeberlen ......... H01L 29/2003 257/194 |
| 2011/0215378 | A1 | 9/2011 | Hwang et al. |
| 2011/0248283 | A1* | 10/2011 | Cao .............. H01L 29/41725 257/76 |
| 2012/0292665 | A1 | 11/2012 | Marino et al. |
| 2012/0305893 | A1 | 12/2012 | Colinge |
| 2012/0313106 | A1* | 12/2012 | He ........................ 257/76 |
| 2013/0015463 | A1* | 1/2013 | Lee .............. H01L 29/66462 257/76 |
| 2013/0032860 | A1* | 2/2013 | Marino .......... H01L 29/66462 257/194 |
| 2013/0099247 | A1* | 4/2013 | Palacios ......... H01L 21/28264 257/76 |
| 2013/0161698 | A1* | 6/2013 | Marino .......... H01L 29/42316 257/194 |
| 2013/0187128 | A1* | 7/2013 | Yi et al. .................. 257/13 |
| 2013/0193446 | A1 | 8/2013 | Chao et al. |
| 2013/0193526 | A1 | 8/2013 | Lo et al. |
| 2013/0207194 | A1 | 8/2013 | Cai et al. |
| 2013/0221366 | A1 | 8/2013 | Curatola et al. |
| 2013/0221409 | A1* | 8/2013 | Nakajima ......... H01L 27/095 257/194 |
| 2013/0334573 | A1 | 12/2013 | Ostermaier et al. |
| 2014/0054546 | A1 | 2/2014 | Liu et al. |
| 2014/0084343 | A1 | 3/2014 | Dewey et al. |
| 2014/0103459 | A1 | 4/2014 | Kinoshita et al. |
| 2014/0120701 | A1 | 5/2014 | Basker et al. |
| 2014/0124791 | A1* | 5/2014 | Curatola et al. .......... 257/76 |
| 2014/0145246 | A1 | 5/2014 | Ning et al. |
| 2014/0197460 | A1 | 7/2014 | Makiyama |
| 2014/0197889 | A1 | 7/2014 | Makiyama |
| 2014/0264487 | A1 | 9/2014 | Pham et al. |
| 2014/0264488 | A1 | 9/2014 | Fronheiser et al. |
| 2014/0264575 | A1 | 9/2014 | Tsai et al. |
| 2014/0264592 | A1 | 9/2014 | Oxland et al. |
| 2014/0264598 | A1 | 9/2014 | Cheng et al. |
| 2014/0264600 | A1 | 9/2014 | Adam et al. |
| 2014/0284723 | A1 | 9/2014 | Lee et al. |
| 2014/0291760 | A1 | 10/2014 | Cheng et al. |
| 2014/0312396 | A1 | 10/2014 | Ito |
| 2014/0335670 | A1* | 11/2014 | Basker et al. ............ 438/237 |
| 2014/0374800 | A1* | 12/2014 | Cheng et al. ............. 257/192 |
| 2015/0034906 | A1* | 2/2015 | Xiao ...................... 257/24 |
| 2015/0249134 | A1* | 9/2015 | Ostermaier ......... H01L 29/0649 257/76 |

OTHER PUBLICATIONS

Uemoto, Y. "A Normally-off AlGaN/GaN Transistor with RonA=2. 6m-ohm-cm2 and BVds=640 V Using Conductivity Modulation" Int. Elec. Dev. Meet. 2006 Dec. 13, 2006 pp. 1-4.*

Heikman, S et al., "Polarization effects in AlGaN/GaN and GaN/AlGaN/GaN heterostructures", Journal of Applied Physics, Jun. 2003, pp. 10114-10118, vol. 93, No. 12.

Im, et al., "Heterojunction-Free GaN Nanochannel FinFETs With High Performance.", IM, K., et al. "Heterojunction-Free GaN Nanochannel FinFETs With High Performance." IEEE Electron Device Letters, Mar. 2013, pp. 381-383, vol. 34, No. 3, IEEE Electron Devices Society.

Im, et al., "High-Performance GaN-Based Nanochannel FinFETs With/Without AlGaN/GaN Heterostructure", Im, K., et al. "High-Performance GaN-Based Nanochannel FinFETs With/Without AlGaN/GaN Heterostructure." IEEE Transactions on Electron Devices, Oct. 2013, pp. 3012-3018, vol. 60, No. 10, IEEE Electron Devices Society.

Ishida, H et al., "GaN-based natural super junction diodes with multi-channel structures", IEEE International Electron Devices Meeting, Dec. 15-17, 2008, pp. 1-4, San Francisco, CA.

Ishida, H et al., "Unlimited High Breakdown Voltage by Natural Super Junction of Polarized Semiconductor", IEEE Electron Device Letter, Oct. 2008, pp. 1087-1089, vol. 29, No. 10.

Lu, et al., "Tri-Gate Normally-Off GaN Power MISFET", Lu, B., et al., "Tri-Gate Normally-Off GaN Power MISFET." IEEE Electron Device Letters, Mar. 2012, pp. 360-362, vol. 33, No. 3, IEEE Electron Devices Society.

Uemoto, Y et al., "Gate Injection Transistor (GIT) a normally of AlGaN GaN Power Transistor Using Conductivity Modulation", IEEE Transaction of Electron Devices, Dec. 2007, pp. 3393-3399, vol. 54, No. 12.

* cited by examiner

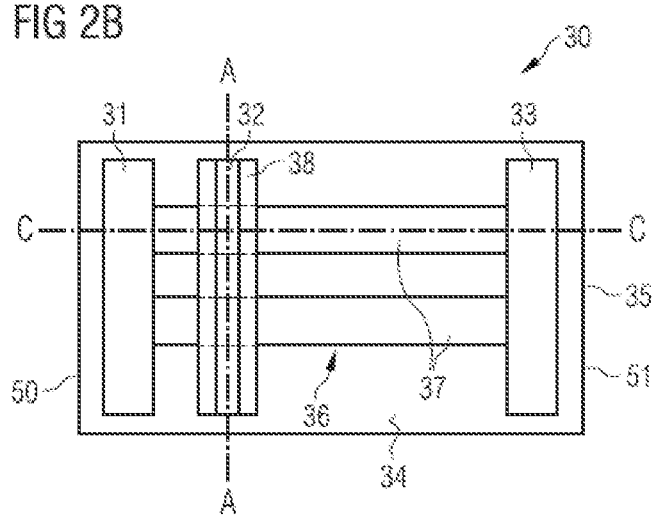
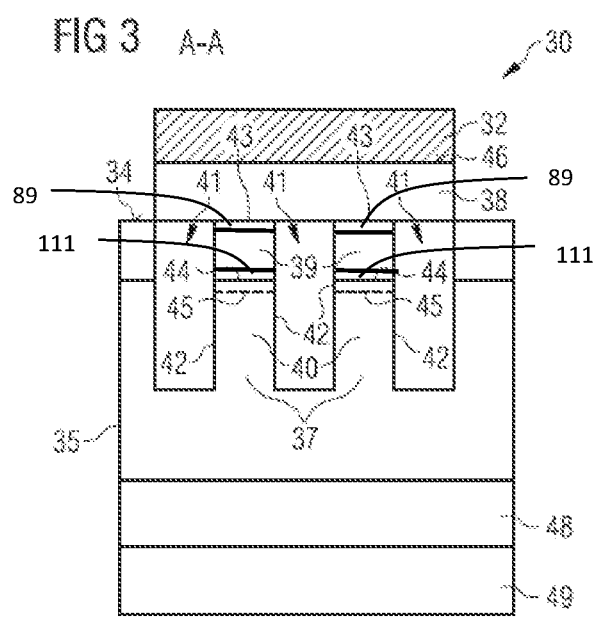

FIG 4  B-B
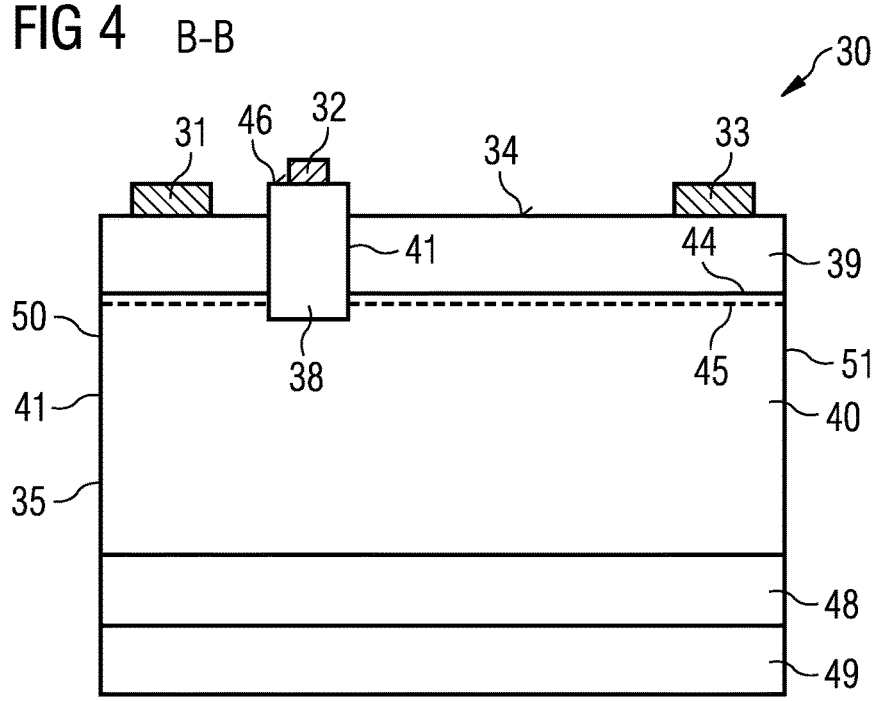
FIG 5  C-C
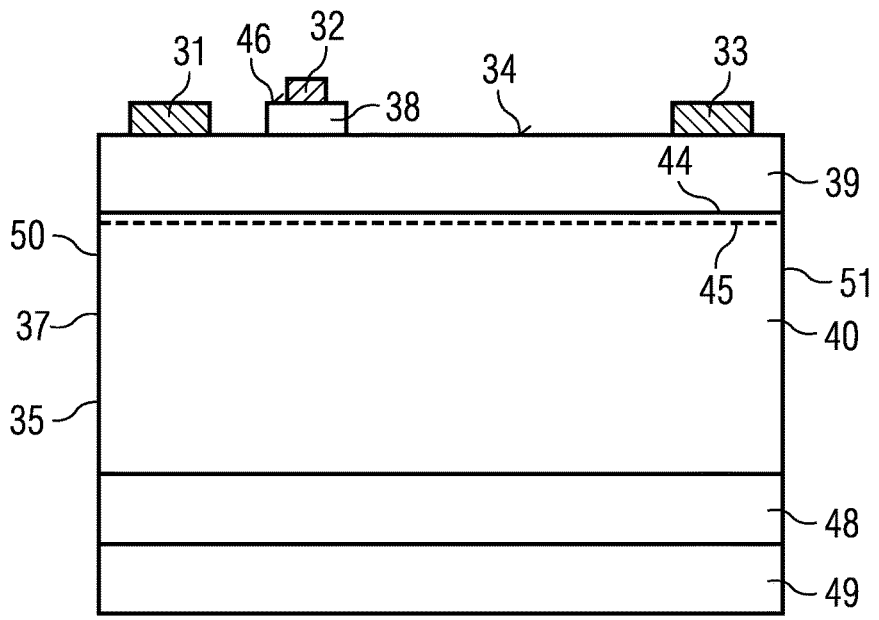

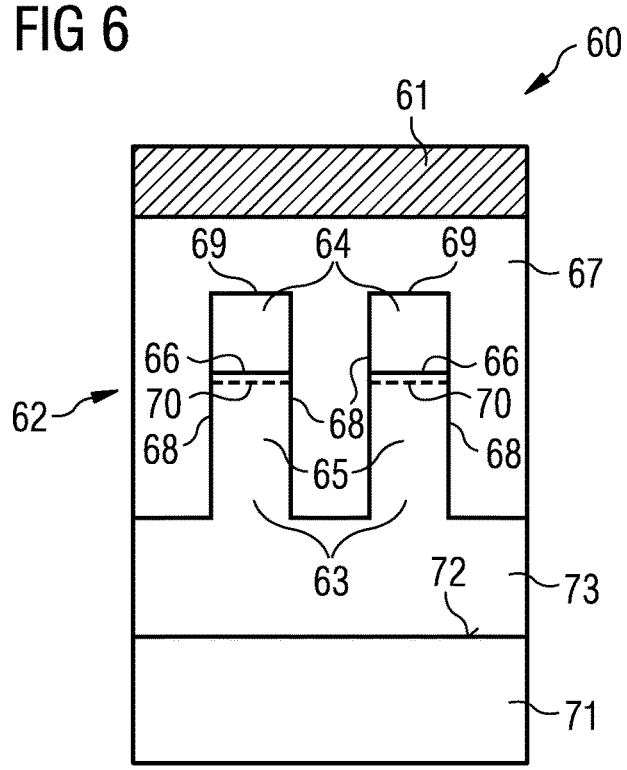
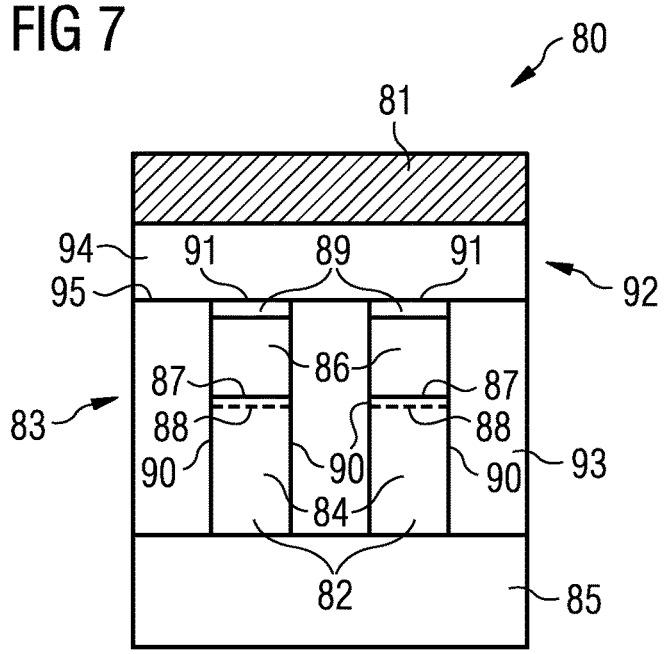

GROUP III-NITRIDE-BASED ENHANCEMENT MODE TRANSISTOR HAVING A HETEROJUNCTION FIN STRUCTURE

BACKGROUND

To date, transistors used in power electronic applications have typically been fabricated with silicon (Si) semiconductor materials. Common transistor devices for power applications include Si CoolMOS, Si Power MOSFETs, and Si Insulated Gate Bipolar Transistors (IGBTs). More recently, silicon carbide (SiC) power devices have been considered. Group III-N semiconductor devices, such as gallium nitride (GaN) devices, are now emerging as attractive candidates to carry large currents, support high voltages and to provide very low on-resistance and fast switching times.

SUMMARY

In an embodiment, a Group III-nitride-based enhancement mode transistor includes a heterojunction fin structure. Side faces and a top face of the heterojunction fin structure are covered by a p-type Group III-nitride layer.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 2b illustrates a top view of a Group III-nitride-based enhancement mode transistor.

FIG. 3 illustrates a cross-sectional view of the Group III-nitride-based enhancement mode transistor according to the second embodiment along the line A-A.

FIG. 4 illustrates a cross-sectional view of the Group III-nitride-based enhancement mode transistor according to the second embodiment along the line B-B.

FIG. 5 illustrates a cross-sectional view of the Group III-nitride-based enhancement mode transistor according to the second embodiment along the line C-C.

FIG. 6 illustrates a cross-sectional view of a Group III-nitride-based enhancement mode transistor according to a third embodiment.

FIG. 7 illustrates a cross-sectional view of a Group III-nitride-based enhancement mode transistor according to a fourth embodiment.

DETAILED DESCRIPTION

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, the terms "coupled" and/or "electrically coupled" are not meant to mean that the elements must be directly coupled together-intervening elements may be provided between the "coupled" or "electrically coupled" elements.

A depletion-mode device, such as a high-voltage depletion-mode transistor, has a negative threshold voltage which means that it can conduct current at zero gate voltage. These devices are normally on. An enhancement-mode device, such as a low-voltage enhancement-mode transistor, has a positive threshold voltage which means that it cannot conduct current at zero gate voltage and is normally off.

As used herein, the phrase "Group III-Nitride" refers to a compound semiconductor that includes nitrogen (N) and at least one Group III element, including aluminum (Al), gallium (Ga), indium (In), and boron (B), and including but not limited to any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), for example. Aluminum gallium nitride refers to an alloy described by the formula $Al_xGa_{(1-x)}N$, where x<1.

Figure 1:
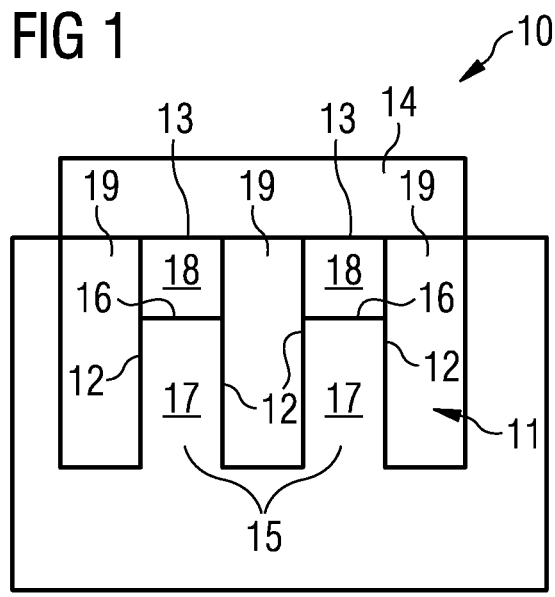
FIG. 1 illustrates a cross-sectional view of a Group III-nitride-based enhancement mode transistor according to a first embodiment.

FIG. 1 illustrates a Group III-nitride-based enhancement mode transistor 10 according to a first embodiment that includes a heterojunction fin structure 11. Side faces 12 and a top face 13 of the heterojunction fin structure 11 are covered by a p-type Group III-nitride layer 14.

The inclusion of the p-type Group III-nitride layer 14 covering the side faces 12 and top face 13 of the heterojunction fin structure 11 may be used to convert a Group III-nitride-based transistor structure, which without the p-type Group III-nitride layer would be a depletion mode transistor, into an enhancement mode transistor.

The heterojunction fin structure 11 may include one or more fins 15 which may also be described as mesa structures. The fins 15 may have a strip-like form and extend substantially parallel to one another. The heterojunction fin structure 11 may include a first Group III-nitride semiconductor layer 18 arranged on a second Group III-nitride semiconductor layer 17 such that the heterojunction 16 is formed at the interface between the first Group III-nitride semiconductor layer 18 and the second Group III-nitride semiconductor layer 17. Each of the fins 15 includes a heterojunction 16 formed between two Group III-nitride materials 17, 18 of having differing band gaps. Regions between neighbouring fins 15 may be considered as trenches 19 and these trenches 19 are filled with the p-type Group III-nitride layer 14. Additionally, the group p-type Group III-nitride layer 14 covers the top face 13 of the fins 15.

The Group III-nitride-based enhancement mode transistor may further include a gate electrode arranged on the p-type Group III-nitride layer 14. The gate electrode may be arranged directly on the p-type Group III-nitride layer 14 or the gate dielectric may be arranged between the gate electrode and the p-type Group III-nitride layer.

The gate electrode arranged on the p-type Group III-nitride layer and extending into regions between neighbouring fins of the heterojunction fin structure. The p-type Group III-nitride layer may lines walls of trenches defining neighbouring fins of the heterojunction fin structure.

The p-type Group III-nitride layer 14 encapsulates the heterojunction fin structure 11 in order to overcome the limitation of the achievable build-in potential by the barrier layer of the heterojunction. The heterojunction fin structure 11 may be used to provide a trench-like gate structure with side wall p-type Group III-nitride regions forming a lateral depletion and a top p-type Group III-nitride region forming vertical depletion of the remaining fin which includes a heterojunction 16. In the case of an aluminium gallium nitride/gallium nitride, the heterojunction fin structure 11 includes a two dimensional electron gas (2DEG) channel.

This arrangement provides a triple junction-based depletion mechanism to ensure normally off transistor behaviour of the device which may be achieved even with a higher NS density obtained either by a thicker aluminium gallium nitride barrier layer or higher doping aluminium doping in the barrier layer. The threshold voltage in this device structure is dependent on the junction parameters (the doping level of the p-type Group III-nitride layer and the width of the fin. Therefore, the carrier density is not restricted by the building potential of the PN junction. If the barrier layer is increased, the fin may be reduced in width according to the amount of the depleted charges in the space charge region. Hence, sheet resistances of below 800 ohms/sq are provided without increasing the device capacitance (per area).

The p-type Group III-nitride layer 14 may fill regions between neighbouring fins 15 of the heterojunction fin structure 11.

The heterojunction fin structure 11 may be deposited on a substrate or the heterojunction fin structure may be fabricated by introducing trenches in a substrate to produce the fins. For example, trenches 19 may be formed in a surface of the substrate including a first Group III-nitride layer 18 arranged on a second Group III-nitride layer 17 such that the mesa structures in the form of fins 15 including the heterojunction 16 are formed between adjacent trenches 19.

The p-type Group III-nitride layer 14 may be coupled to the gate electrode. The Group III-nitride-based enhancement mode transistor may further include a Group III-nitride back barrier layer. The Group III-nitride back barrier layer may be arranged below the second Group III-nitride layer 17 and may include a material having the composition of the first Group III-nitride layer. For example, the first Group III-nitride layer 18 may include aluminium gallium nitride ($Al_xGa_{(1-x)}N$), the second Group III-nitride layer 17 may include gallium nitride (GaN) and the Group III-nitride back barrier layer may include aluminium gallium nitride ($Al_xGa_{(1-x)}N$). The back barrier layer may be positioned below the base of the fins of the heterojunction fin structure or may be positioned within the fins.

The Group III-nitride-based enhancement mode transistor 10 may include a Group III-nitride cap layer arranged between the top face 13 of the heterojunction fin structure 11 and the p-type Group III-nitride layer 14.

The p-type Group III-nitride layer 14 may include a top layer arranged on the top face of the heterojunction fin structure 11 and on side layers including a p-type Group III-nitride.

The p-type Group III-nitride layer may include side layers covering the side faces of the heterojunction fin structure 11 which are doped, for example with Magnesium. In embodiments in which a top layer and side layers for the p-type Group III-nitride layer provided, the side layers may be Magnesium doped by implantation, whereas the top layer may be epitaxially doped with Magnesium. The top layer may be a regrown layer which is Magnesium doped.

The heterojunction fin structure 11 may include a plurality of fins 15. The heterojunction fin structure 11 may include a Group III-nitride barrier layer, which may include aluminium gallium nitride, for example, stacked on Group III-nitride channel layer, which may include gallium nitride, for example.

The Group III-nitride-based enhancement mode transistor 10 may further include a Group III-nitride interlayer 111 (as depicted in FIG. 3) arranged between the Group III-nitride barrier layer and a Group III-nitride channel layer.

Figure 2A:
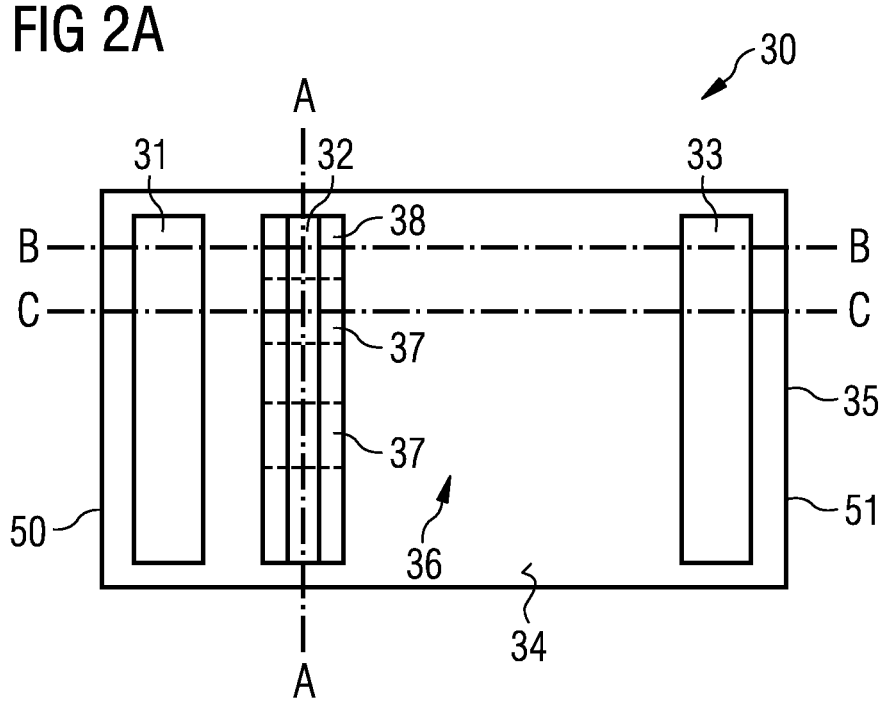
FIG. 2a illustrates a top view of a Group III-nitride-based enhancement mode transistor according to a second embodiment.

FIG. 2a illustrates a top view of a Group III-nitride-based enhancement mode transistor 30 according to a second embodiment. FIG. 3 illustrates a cross-sectional view of the Group III-nitride-based enhancement mode transistor 30 along the line A-A. FIG. 4 illustrates a cross-sectional view of the Group III-nitride-based enhancement mode transistor 30 along the line B-B. FIG. 5 illustrates a cross-sectional view of the Group III-nitride-based enhancement mode transistor 30 along the line C-C.

Turning to FIG. 2a, the Group III-nitride-based enhancement mode transistor 30 includes a source 31 a gate 32 and a drain 33 arranged on the upper surface 34 of a Group III-nitride-based semiconductor body 35. The source 31, gate 32 and drain 33 may include a metal or alloy. The Group III-nitride-based enhancement mode transistor 30 includes a heterojunction fin structure 36 including a plurality of fins 37 of which two are illustrated in the drawings for ease of illustration. The Group III-nitride-based enhancement mode transistor 30 may include a single fin 37 or more than two fins 37. The fins 37 extend from the source 31 arranged adjacent a first side 50 of the semiconductor body 35 to the drain 33 which is arranged adjacent an opposing side of the semiconductor body 35. The gate 32 is arranged between the source 31 and the drain 33. The source 31, the gate 32 and the drain 33 have a strip like form which extends substantially perpendicular to the length of the fins 37.

The Group III-nitride-based enhancement mode transistor 30 further includes a p-type Group III-nitride layer in the form of a p-type gallium nitride layer 38. The p-type gallium nitride layer 38 has a strip like form and extends over the side faces and top faces of a portion of the fins 37 of the heterojunction fin structure 36. The p-type gallium nitride layer 38 is positioned underneath the gate 32 and may have a lateral area that is slightly greater than that of the gate 32.

However, the arrangement of the p-type gallium nitride layer 38 and the gate 32 is not limited to this arrangement. In other embodiments, the gate 32 may partially overlap the p-type gallium nitride layer 38 and may partially extend outside of the p-type gallium nitride layer 38. The contact area between the gate 32 and the p-type gallium nitride layer 38 may be less than the surface area of the upper surface of the p-type gallium nitride layer 38.

The p-type gallium nitride layer 38 is electrically coupled to the gate 32. The contact between the metal forming the gate 32 and the p-type gallium nitride layer 38 may be an ohmic contact, a Schottky contact or a MIS contact.

The fins 37 may have differing lengths. In the embodiment illustrated in FIG. 2a, the fins 37 are arranged only in a region under the gate 32 and have a length corresponding to the length of the p-type gallium nitride layer 38. The regions of the semiconductor body 35 outside of the region of the gate 32 have no fins. In a further embodiment, which is illustrated in FIG. 2b, the fins 37 extend from the source 31 arranged adjacent a first side 50 of the semiconductor body 35 to the drain 33 which is arranged adjacent an opposing side of the semiconductor body 35 and have strip-like form.

The arrangement of the p-type gallium nitride layer 38 and the heterojunction fin structure 36 will now be explained with reference to cross-sectional views of the Group III-nitride-based enhancement mode transistor 30, whereby FIG. 3 illustrates a cross-sectional view of the Group III-nitride-based enhancement mode transistor 30 taken along the line A-A indicated in FIG. 2.

FIG. 3 illustrates a cross-section along the length of the gate 32 and illustrates a cross-sectional view of the fins 37 of the heterojunction fin structure 36. Each of the fins 37 includes a first Group III-nitride layer 39 in the form of a gallium aluminium gallium nitride layer 39 at forming the upper portion of the fin 37. The first aluminium gallium nitride layer 39 is positioned on a second Group III-nitride layer in the form of the gallium nitride layer 40 which forms the lower portion of the fin 37. The fins 37 can be considered as mesa structures formed in the semiconductor body 35 by the formation of trenches 41 which extend substantially parallel to one another and which define side faces 42 of the fins 37. The p-type gallium nitride layer 38 covers the side faces 42 and the top faces 43 of the fins 37.

The each of the fins 37 includes two Group III-nitride compounds of differing composition and differing bandgaps. Consequently, a heterojunction 44 is formed between the first aluminium gallium nitride layer 39 and the gallium nitride layer 40.

When the Group III-nitride-based enhancement mode transistor 30 is switched on, a two-dimensional electron gas (2DEG) providing a channel 45 is formed at the heterojunction 44, in particular, in the upper region of the gallium nitride layer 40. The position of the channel 45 in the "on" state of the Group III-nitride-based enhancement mode transistor 30 is illustrated in FIGS. 3 to 5. In the "off" state, there is no channel and no two dimensional electron gas. Therefore, the gallium nitride layer 40 may be denoted as a channel layer and the aluminium gallium nitride layer 39 may be denoted as a barrier layer. The gate 32 is arranged directly on the upper surface 46 of the p-type gallium nitride layer 38 which is positioned above the upper surface 34 of the semiconductor body 35. The gate 32 is therefore electrically coupled to the p-type gallium nitride layer 38 so that the p-type gallium nitride layer 38 is at gate potential.

The Group III-nitride-based transistor 30 includes a substrate 49, for example a silicon substrate, sapphire substrate or silicon carbide substrate on which a buffer layer 48, for example aluminium nitride is deposited. The gallium nitride channel layer 40 is arranged on the buffer layer 48.

FIG. 4 illustrates a cross-sectional view along the line B-B indicated in FIG. 2 and illustrates a cross-section of the Group III-nitride-based enhancement mode transistor through a trench 41 adjacent a side face of a fin 37. In the cross-sectional view of FIG. 4, it can be seen that the p-type gallium nitride layer 38 fills a trench 41 which extends from the upper surface 34 of the semiconductor body 35 through the aluminium gallium nitride layer 39 and into the gallium nitride layer 40 such that the heterojunction 44 between the aluminium gallium nitride layer 39 and the gallium nitride layer 40 and channel 45 is covered by a portion of the p-type gallium nitride layer 38.

FIG. 5 illustrates a cross-sectional view of the Group III-nitride-based enhancement mode transistor 30 along the line C-C. FIG. 5 illustrates a cross-sectional view along the length of a fin 37. FIG. 5 illustrates that the p-type gallium nitride layer 38 is positioned on the top surface 34 of the fin 37. The fin 37 extends continuously from the first side 50 of the semiconductor body 35 adjacent which the source 31 is positioned to the opposing side 51 of the semiconductor body 35 adjacent which the drain 33 is positioned.

FIG. 6 illustrates a cross-sectional view of a Group III-nitride-based enhancement mode transistor 60 according to a third embodiment. The cross-sectional view is taken along the length of the gate 61 which covers a heterojunction fin structure 62. The heterojunction fin structure 62 includes a plurality of fins 63, each extending substantially parallel to one another in front of the plane illustrated in FIG. 6 and behind the plane illustrated in FIG. 6.

Each of the fins 63 includes an upper portion 64 including a first Group III-nitride compound and the lower portion 65 including a second Group III-nitride compound such that a heterojunction 66 is formed between them. The first Group III-nitride compound may include aluminium gallium nitride and the second Group III-nitride compound may include gallium nitride.

The fins 63 are encapsulated by a p-type Group III-nitride compound in the form of a p-type gallium nitride layer 67. The p-type gallium nitride layer 67 covers side faces 68 of the fins 63 and the top faces 69 of the fins 63. The gate 61 is positioned directly on the upper surface of the p-type gallium nitride layer 67 and is electrically coupled to the p-type gallium nitride layer 67.

The Group III-nitride-based enhancement mode transistor 60 according to the third embodiment further includes a Group III-nitride-based back barrier layer 71 which is positioned on a lower surface 72 of a Group III-nitride-based layer 73 from which the lower portions 65 of the fins 63 protrude. The Group III-nitride-based back barrier layer 71 may include an aluminium gallium nitride layer having a wider bandgap than the Group III-nitride-based layer 73. The back barrier layer 71 may be used to improve the channel confinement. The back barrier layer 71 may be arranged on a buffer layer arranged on a substrate.

The first Group III-nitride-based compound of the upper portion 64 has a wider bandgap than the second Group III-nitride-based compound of the lower portion 65 such that a 2DEG channel is formed in the upper region of the second Group III-nitride layer 65 when the Group III-nitride-based enhancement mode transistor 60 is switched on. The position of the 2 DEG channel is illustrated schematically with the dashed line 70 in FIG. 6.

The first Group III-nitride-based layer 64 may be considered a barrier layer and the second Group III-nitride-based layer 65 may be considered as a channel layer.

The p-type Group III-nitride-based layer 67 may be considered to include protruding portions which protrude into trenches formed between the defining the fins 63.

FIG. 7 illustrates a portion of a cross-sectional view of a Group III-nitride-based enhancement mode transistor 80 according to a fourth embodiment. In particular, FIG. 7 illustrates a cross-sectional view along the length of the gate 81 and illustrates a cross-sectional view of two of the fins 82 of a heterojunction fin structure 83. The fins 82 extend substantially parallel to one another into the plane of the paper. Each of the fins 82 includes a lower portion 84 arranged on a first Group III-nitride-based layer 85 and an upper portion 86 including a second Group III-nitride-based compound. The lower portion 84 may include the composition of the first Group III-Nitride layer 85.

The second Group III-nitride-based compound of the upper portion 86 has a different lattice constant and bandgap from the Group III-nitride compound of the lower portion 84. For example, the first Group III-nitride-based layer 85 and the lower portion 84 of the fins 82 may include gallium nitride and the upper portion 86 may include aluminium gallium nitride. The fins 82 each include a heterojunction 87 formed between the first Group III-nitride-based compound of the lower portion 84 and the second Group III-nitride-based layer of the upper portion 86. Due to the differing lattice constants and bandgaps a two-dimensional gas channel is formed in the upper region of the lower portion 84 of the fin 81 adjacent to the heterojunction 87 when the Group III-nitride-based enhancement mode transistor 80 is in the "on" state. The position of the two-dimensional gas channel is illustrated schematically with the dashed line 88 in FIG. 7.

Each of the fins 82 further includes a Group III-nitride-based cap layer 89 (shown in FIGS. 3 and 7) positioned on the upper portion 86. The Group III-nitride-based cap layer 89 may include gallium nitride, for example. The Group III-nitride-based cap layer 89 may act as a protective layer for the underlying second Group III-nitride-based compound of the upper portion 86. The side faces 90 and top faces 91 of the fins 82 are covered by a p-type Group III-nitride-based layer 92.

In this embodiment, the p-type Group III-nitride-based layer 92 includes two sub-layers. The first sub-layer 93 covers the side faces 90 of the fins 82 and a second sub-layer 94 covers the top faces 91 of the fins 82 and the top faces 95 of the first sub-layer 93. The gate 81 is positioned directly on the second sub-layer 94. The first sub-layer 93 and the second sub-layer 94 may be deposited using the same or different processes. For example, the first p-type sub-layer 93 may be deposited and doped by Magnesium implantation and the second p-type sub-layer 94 may be a regrown layer. The first sub-layer 93 and the second sub-layer 94 may both be regrown. In embodiments in which both the first sub-layer 93 and the second sub-layer 94 are regrown, the first sub-layer and the second sub-layer may be integral such that there is no discernible interface between the sub-layer layer 93 and the second sub-layer 94.

The fins 82 may be fabricated by selective deposition of the first Group III-nitride-based layer to provide the lower portion 84, the second Group III-nitride-based layer to provide the upper portion 86 and the cap layer 89 to build up the fins 82 on a Group III-nitride-based base layer 85. The Group III-nitride-based base layer 85 may include the same composition as the first Group III-nitride-based compound of the lower portion 84 or may have a different composition, such as that of a suitable buffer layer material, for example AlN. The Group III-nitride-based base layer 85 may be arranged on a buffer layer arranged on a substrate.

Figure 8:
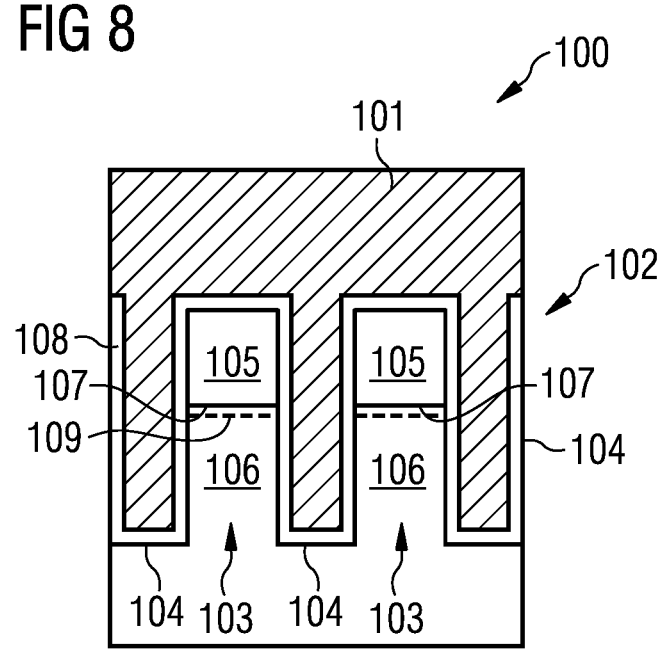
FIG. 8 illustrates a cross-sectional view of a Group III-nitride-based enhancement mode transistor according to a fifth embodiment.

FIG. 8 illustrates a cross-sectional view of a Group III-nitride-based enhancement mode transistor 100 according to a fifth embodiment.

The cross-sectional view is taken along the length of the gate 101 which covers a heterojunction fin structure 102. The heterojunction fin structure 102 includes a plurality of fins 103 defined by trenches 104.

Each of the fins 103 includes an upper portion 105 including a first Group III-nitride compound and the lower portion 106 including a second Group III-nitride compound such that a heterojunction 107 is formed between them. The first Group III-nitride compound may include aluminium gallium nitride and the second Group III-nitride compound may include gallium nitride.

The trenches 104 are lined with the p-type Group III nitride layer 108 such that two opposing side faces 109 and the top face 110 of the fins 103 are covered by the p-type Group III-nitride layer 108. The p-type Group III-nitride layer 108 may include p-type gallium nitride, for example. In this embodiment, the p-type Group III-nitride layer does not fill the trenches 104. The gate 101 is positioned directly on the upper surface of the p-type gallium nitride layer 108 and extends into the trenches 104 and extends between portions of the Group III-nitride layer 108 positioned on opposing walls of the trenches 104. The gate 101 is electrically coupled to the p-type Group III-nitride layer 108.

The first Group III-nitride-based compound of the upper portion 104 has a wider bandgap than the second Group III-nitride-based compound of the lower portion 105 such that a 2DEG channel is formed in the upper region of the second Group III-nitride layer 105 when the Group III-nitride-based enhancement mode transistor 100 is switched on. The position of the 2 DEG channel is illustrated schematically with the dashed line 109 in FIG. 8.

The various embodiments described herein may be combined with one another. For example, the Group III-nitride-based back barrier layer may be used along with a Group III-nitride-based cap layer.

The Group III-nitride-based enhancement mode transistor according to any one of the embodiments described herein may also include a conductive source region which extends from the upper surface of the semiconductor body into the barrier layer such that it is coupled to the 2DEG channel and by also include a conductive source region which extends from the upper surface of the semiconductor body into the barrier layer and which is electrically coupled to the 2DEG channel.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures.

Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A Group III-nitride-based enhancement mode transistor comprising a substrate, a buffer layer formed on the substrate, a body region formed on the buffer layer, a heterojunction fin structure comprising a plurality of fins, each fin being formed on the body region, and a Group III-nitride cap layer arranged on a top face of the heterojunction fin structure, wherein the heterojunction fin structure completely extends from a source of the transistor to a drain of the transistor, wherein the heterojunction fin comprises a plurality of mesas comprising a Group III-nitride barrier layer stacked on a Group III-nitride channel layer and forming a heterojunction with the Group III-nitride channel layer, and a Group III-nitride interlayer arranged between the Group III-nitride barrier layer and the Group III-nitride channel layer, wherein a continuous portion of the body region provides a base region that is disposed below the plurality of the fins and provides the Group III-nitride channel layer of each fin.

2. The Group III-nitride-based enhancement mode transistor of claim 1, further comprising a gate electrode arranged on the Group III-nitride barrier layer.

3. The Group III-nitride-based enhancement mode transistor of claim 1, wherein the heterojunction fin structure is deposited on a substrate.

4. The Group III-nitride-based enhancement mode transistor of claim 1, further comprising a Group III-nitride back barrier layer.

5. The Group III-nitride-based enhancement mode transistor of claim 1, further comprising a gate electrode arranged on the heterojunction fin structure, the gate electrode extending into regions between neighbouring fins of the heterojunction fin structure.

6. The Group III-nitride-based enhancement mode transistor of claim 1, further comprising a gate electrode arranged on the Group III-nitride barrier layer, and wherein the fins extend from the source arranged adjacent a first side of the semiconductor body to the drain which is arranged adjacent an opposing side of the semiconductor body and have a strip-like form.

7. A semiconductor device comprising:
 a Group III-nitride-based transistor having a fin structure,
 a p-type Group III-nitride layer arranged on at least one of a side face and a top face of at least one fin of the fin structure;
 a metal gate electrode arranged on the p-type Group III-nitride layer;
 wherein the Group III-nitride-based transistor is an enhancement mode device, and
 wherein a total contact area between the gate and the p-type Group III-nitride layer is less than a surface area of the upper surface of the p-type Group III-nitride layer.

8. The semiconductor device of claim 7, wherein the fin structure comprises a first Group III-nitride semiconductor layer arranged on a second Group III-nitride semiconductor layer so as to form a heterojunction arranged within a fin of the fin structure.

9. The semiconductor device of claim 7, wherein the p-type Group III-nitride layer is positioned underneath the gate electrode and has a total lateral area that is greater than that of the gate.

* * * * *